United States Patent
Hirukawa

(10) Patent No.: US 6,775,311 B2
(45) Date of Patent: Aug. 10, 2004

(54) SEMICONDUCTOR LASER DEVICE AND OPTICAL DISK RECORDING AND REPRODUCING APPARATUS

(75) Inventor: Shuichi Hirukawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/241,838

(22) Filed: Sep. 12, 2002

(65) Prior Publication Data

US 2003/0048825 A1 Mar. 13, 2003

(30) Foreign Application Priority Data

Sep. 13, 2001 (JP) ........................................ 2001-278135

(51) Int. Cl.$^7$ ................................................ H01S 5/00
(52) U.S. Cl. ........................................ 372/46; 372/43
(58) Field of Search ..................................... 372/43–46

(56) References Cited

U.S. PATENT DOCUMENTS

| | | | | |
|---|---|---|---|---|
| 4,864,581 A | * | 9/1989 | Nelson et al. ................. | 372/46 |
| 4,935,936 A | * | 6/1990 | Nelson et al. ................. | 372/46 |
| 5,319,661 A | * | 6/1994 | Irikawa et al. ................. | 372/46 |
| 5,400,355 A | * | 3/1995 | Ishida .......................... | 372/46 |
| 5,556,804 A | * | 9/1996 | Nagai ............................ | 438/5 |
| 6,118,800 A | * | 9/2000 | Kidoguchi et al. ........... | 372/46 |
| 6,292,502 B1 | * | 9/2001 | Shimada ....................... | 372/45 |
| 2002/0159493 A1 | * | 10/2002 | Honkawa et al. ............. | 372/46 |
| 2002/0187577 A1 | * | 12/2002 | Sakata et al. ................. | 438/39 |

FOREIGN PATENT DOCUMENTS

JP 3064980 3/1991

* cited by examiner

Primary Examiner—Don Wong
Assistant Examiner—Phillip Nguyen
(74) Attorney, Agent, or Firm—Morrison & Foerster LLP

(57) ABSTRACT

There is provided a semiconductor laser device implementing a single transverse mode oscillation in an oscillation wavelength of 780 nm band and also having high reliability and long life in high-output driving state, and an optical disk recording and reproducing apparatus with use of the semiconductor laser device. A multiple quantum well active layer 105 is composed of InGaAsP, and a first cladding layer 103, a second cladding layer 107, a third cladding layer 109, and a first current blocking layer 112 are structured from III–V group compound semiconductor containing only As as V group element. Inside the first current blocking layer 112, a hollow portion 130 is provided in the vicinity of and approximately parallel to the ridge stripe-shaped third cladding layer 109.

14 Claims, 4 Drawing Sheets

SEMICONDUCTOR LASER DEVICE AND OPTICAL DISK RECORDING AND REPRODUCING APPARATUS

BACKGROUND OF THE INVENTION

The present invention relates to a semiconductor laser device, more specifically a semiconductor laser device capable of realizing high power and high reliability, and to an optical disk recording and reproducing apparatus using the same.

In recent years, with demands for faster and larger-capacity semiconductor laser devices applied to optical communications devices and optical recording apparatuses, research and development have been promoted for improving various properties of the semiconductor laser devices.

Among the semiconductor laser devices, those having an oscillation wavelength of 780 nm band for use in optical disk reproducing apparatuses and optical disk recording and reproducing apparatuses such as CD and CD-R/RW are conventionally made of AlGaAs based materials and typically have ridge stripe shape.

Generally in such semiconductor laser device, in super-imposing a current constriction layer, a portion in the vicinity of a lateral face of a ridge stripe is positioned below an overhang of a contact layer, which prevents material gas from sufficiently reaching the vicinity of the lateral face of the ridge stripe. Further, due to plane orientation of the lateral face of the ridge stripe, there is an area whose crystal growth rate is slow. As a result, the portion in the vicinity of the lateral face of the ridge stripe is not fully filled up and a hollow portion is generated therein.

The above has been disclosed in Japanese Patent Laid-Open Publication HEI No. 3-64980, in which a means for eliminating the hollow portion has been proposed to solve a problem that the hollow portion has a low refractive index and therefore a single transverse mode oscillation is difficult to produce, and the like. A schematic view thereof is shown in FIG. 8, with reference to which outlined description will be made hereinbelow.

The semiconductor laser device is so structured that on top of a GaAs substrate 501, there are laminated in sequence an AlGaAs first cladding layer 502, an AlGaAs active layer 503, an AlGaAs second cladding layer 504, and a GaAs contact layer 505. Further, there is spattered an $SiO_2$ film (unshown), which is formed into a stripe shape by a usual photo step. Then, with the $SiO_2$ film as a mask, the contact layer 505 and the second cladding layer 504 are etched by chemical etching to make the second cladding layer 504 into ridge stripe shape.

With the $SiO_2$ film as a mask for selective growth, there is formed a GaAs current constriction layer 506 on the both sides of the ridge stripe-shaped second cladding layer 504. After that, the $SiO_2$ film is removed and the other contact layer 505 is laminated on the entire surface of the already formed contact layer 505 and the GaAs current constriction layer 506 so that the laminated contact layer 505 is integrated with them.

In the above conventional example, the hollow portion is eliminated to stabilize transverse mode oscillation. However, an inventor of the present invention actually manufactured as an experiment an AlGaAs based high-output semiconductor laser device based on the conventional technique, as a result of which it was confirmed that a maximum optical output thereof is approx. 180 mW, and end face destruction occurs at this optical output level. This is because the presence of active Al tends to generate Al oxide on a laser end face, which prevents implementation of higher output, higher reliability and longer life.

Also in the above conventional example, the contact layer 505 and the second cladding layer 504 are etched into ridge stripe shape with an etchant modified to prevent the stripe-shaped contact layer 505 from protruding from the ridge-strip-shaped second cladding layer 504 in lateral direction like an overhang. This method, however, suffers difficulty in management of etchant and etching time.

SUMMARY OF THE INVENTION

Accordingly, it is an object of the present invention to provide a high-output semiconductor laser device using a GaAs substrate, more specifically a 780 nm-band high-output semiconductor laser device for use in CD-R/RW and the like capable of implementing a single transverse mode oscillation and also implementing high reliability and long life in high-output driving state, as well as to provide an optical disk recording and reproducing apparatus with use of the semiconductor laser device.

In order to accomplish the above object, there is provided a semiconductor laser device comprising in sequence on a GaAs substrate: a first cladding layer having a first conduction type; a quantum well active layer; a second cladding layer having a second conduction type; and a ridge stripe-shaped third cladding layer having a same conduction type as the second cladding layer, as well as a current blocking layer having a first conduction type located on both sides of the third cladding layer, the quantum well active layer being structured from III–V group compound semiconductor containing at least P as V group element, the first cladding layer, the second cladding layer, the third cladding layer, and the current blocking layer being structured from III–V group compound semiconductor containing only As as V group element, and wherein a hollow portion is provided inside the current blocking layer in the vicinity of and approximately parallel to the ridge stripe-shaped third cladding layer.

According to the above configuration, there is implemented a 780 nm-band high-output semiconductor laser device having stabilized transverse mode oscillation, high reliability in high output operation and long life. This is because in the quantum well active layer having an oscillation wavelength of 780 nm band, III–V group compound semiconductor containing P, e.g. InGaAsP based compound semiconductor, has a refractive index smaller than that of AlGaAs based compound semiconductor. More particularly, use of, for example, InGaAsP based materials in the quantum well active layer decreases difference in refractive index between the hollow portion and the quantum well active layer compared to the case of using an active layer made of conventional AlGaAs based materials, which generates acceptable difference of refractive index sufficient for stabilizing a single transverse mode oscillation.

Also in the semiconductor laser device, the hollow portion formed inside the current blocking layer saves an effort at preventing an overhang formed over the ridge stripe-shaped third cladding layer, which facilitates management of etchant and etching time for forming the ridge stripe-shaped third cladding layer.

In one embodiment, right above the ridge stripe-shaped third cladding layer, there is laminated a cap/intermediate layer having a width larger than a width of a lowermost portion of the ridge stripe-shaped third cladding layer.

According to the above embodiment, the hollow portion is located in more suitable position for stabilizing transverse mode oscillation in high-output driving state.

In one embodiment, the ridge stripe-shaped third cladding layer has a reverse mesa shape in cross section.

The reverse mesa shape in cross section herein refers to the shape of a cross section vertical to extending direction of the ridge stripe-shaped third cladding layer, in which the width of the ridge stripe-shaped third cladding layer is narrowed toward the GaAs substrate, or narrowed in the middle.

According to the above embodiment, the ridge stripe-shaped third cladding layer has a reverse mesa shape in cross section, so that the hollow portion is formed in an optimum position. This may provide a semiconductor laser device implementing stabilized transverse mode oscillation in high-output driving state as well as having high reliability and long life.

In one embodiment, a width of the semiconductor layer right above the ridge stripe-shaped third cladding layer is larger than a width of a lowermost portion of the ridge stripe-shaped third cladding layer in a range from 0.48 μm to 1.08 μm in one side.

According to the above embodiment, a width of the semiconductor layer right above the ridge stripe-shaped third cladding layer is larger than a width of a lowermost portion of the ridge stripe-shaped third cladding layer in a range from 0.48 μm to 1.08 μm in one side, which makes it possible to form the hollow portion of an optimum size in an optimum position. Therefore, there may be provided a semiconductor laser device implementing stabilized transverse mode oscillation in high-output driving state as well as having high reliability and long life.

In one embodiment, the third cladding layer and the current blocking layer are provided on an etching stopper layer, and distance between the hollow portion and the etching stopper layer is 0.3 to 0.6 μm.

Herein, the distance between the hollow portion and the etching stopper layer refers to the distance between the lower edge of the hollow portion and the upper face of the etching stopper layer.

In this embodiment, the distance between the hollow portion and the etching stopper layer is set to 0.3 μm or above, which makes it possible to prevent light confining effect from becoming too strong and to restrain absorption of laser light into the GaAs substrate. The distance is also 0.6 μm or less, which prevents optical effects such as light confining effect from becoming too weak. According to the embodiment, therefore, there may be provided a high-output semiconductor laser device having high reliability.

In one embodiment, the current blocking layer is present between a lateral face of the ridge stripe-shaped third cladding layer and the hollow portion, so that the lateral face of the ridge stripe-shaped third cladding layer is not exposed to the hollow portion.

According to the above embodiment, the lateral face of the ridge stripe-shaped third cladding layer is not exposed to the hollow portion, which makes it possible to prevent the lateral face of the third cladding layer from oxidizing, thereby contributing to increase of reliability and life of a semiconductor laser device.

In one embodiment, a lowermost portion of the ridge stripe-shaped third cladding layer has a width of 1.5 to 3.0 μm.

According to the embodiment, a lowermost portion of the ridge stripe-shaped third cladding layer has a width of 1.5 to 3.0 μm, which enables more stable single transverse mode oscillation of laser light.

In one embodiment, the quantum well active layer includes at least a well layer and a barrier layer, and at least the well layer is composed of InGaAsP.

According to the above embodiment, there is provided a 780 nm-band high-output semiconductor laser device in which the transverse mode oscillation is stabilized and which has high reliability and long life in high-output driving state.

In one embodiment, the quantum well active layer is a pseudomorphic quantum well active layer.

According to the above embodiment, the quantum well active layer is the pseudomorphic quantum well active layer, which further makes it possible to obtain a semiconductor laser device with lower threshold current value and higher output.

In one embodiment, the well layer in the quantum well active layer has compressive strain.

According to the above embodiment, the well layer in the quantum well active layer has compressive strain, so that a 780 nm-band semiconductor laser device may be realized with use of, for example, a compressive strained quantum well active layer made of InGaAsP on the GaAs substrate. Since the compressive pseudomorphic quantum well active layer made of InGaAsP is a quantum well active layer without the presence of Al unlike AlGaAs, high output is achievable. Further, the presence of the hollow portion makes it possible to provide a semiconductor laser device with higher reliability and higher output.

In one embodiment, a percentage of compressive strain present in the well layer is within 3.5%.

According to the above embodiment, a percentage of compressive strain present in the well layer is within 3.5%, which makes it possible to implement a semiconductor laser device with higher output, higher reliability and longer life.

In one embodiment, the barrier layer in the quantum well active layer has tensile strain.

According to the above embodiment, the barrier layer in the quantum well active layer has tensile strain, which makes it possible to compensate compressive strain present in the well layer. This enables formation of a pseudomorphic quantum well active layer having more stable crystal, resulting in implementation of a semiconductor laser device with higher reliability.

In one embodiment, a percentage of tensile strain present in the barrier layer is within 3.5%.

According to the above embodiment, a percentage of tensile strain present in the barrier layer is within 3.5%, which implements a semiconductor laser device with higher output, higher reliability and longer life.

In one embodiment, the first cladding layer is composed of two AlGaAs layers each having different Al mixed crystal ratios, out of which one layer closer to the quantum well active layer has higher Al crystal mixed ratio than that of the other layer.

According to the above embodiment, out of two AlGaAs layers having different Al mixed crystal ratios that constitute the first cladding layer, the layer closer to the quantum well active layer has higher Al mixed crystal ratio than that of the other layer. This enables effective sealing of a laser light escaping toward the GaAs substrate, thereby further restraining adsorption of light into the GaAs substrate in high output operation. Therefore, still higher output and higher reliability of the semiconductor laser device may be achieved.

An optical disk recording and reproducing apparatus of the present invention has any one of the above-described semiconductor laser devices.

The semiconductor laser device is used in the optical disk recording and reproducing apparatus, which enables high speed reading and writing operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (Embodiment 1)

Figure 1:
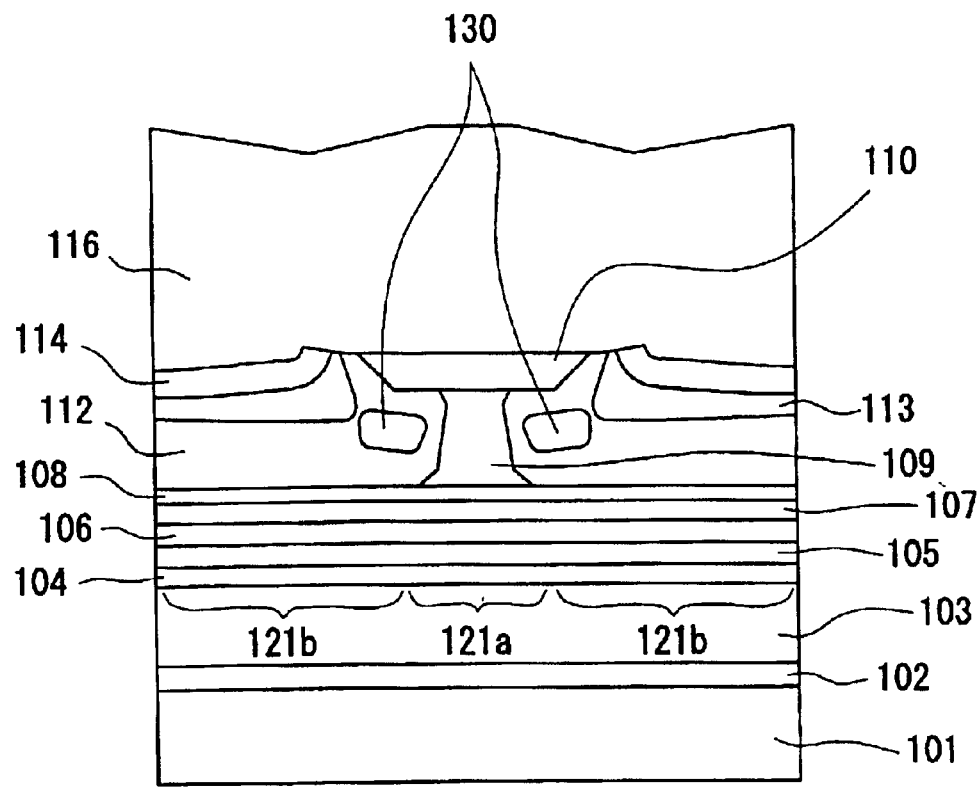
FIG. 1 is a cross sectional view taken along a face vertical to a ridge stripe direction of a semiconductor laser device in an embodiment 1 of the present invention.
Figure 2:
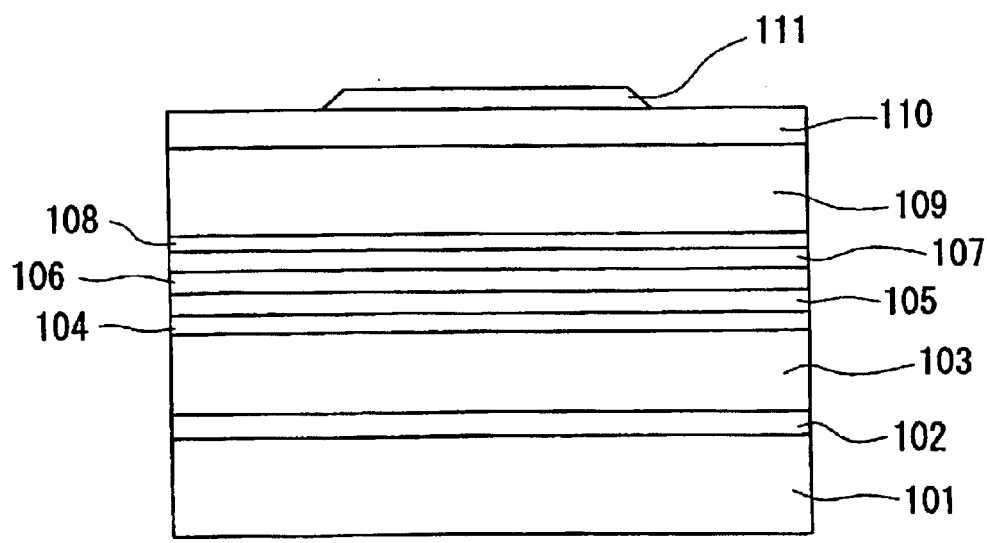
FIG. 2 is a cross sectional view showing the semiconductor laser device in the embodiment 1 of the present invention after completion of first crystal growth mask process.
Figure 3:
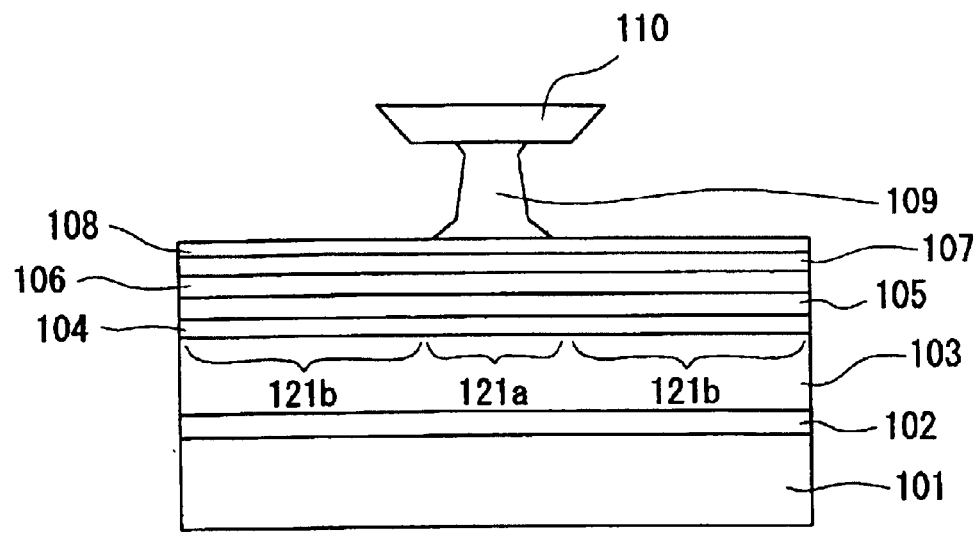
FIG. 3 is a cross sectional view showing the semiconductor laser device in the embodiment 1 of the present invention after completion of etching process for mesa stripe formation.
Figure 4:
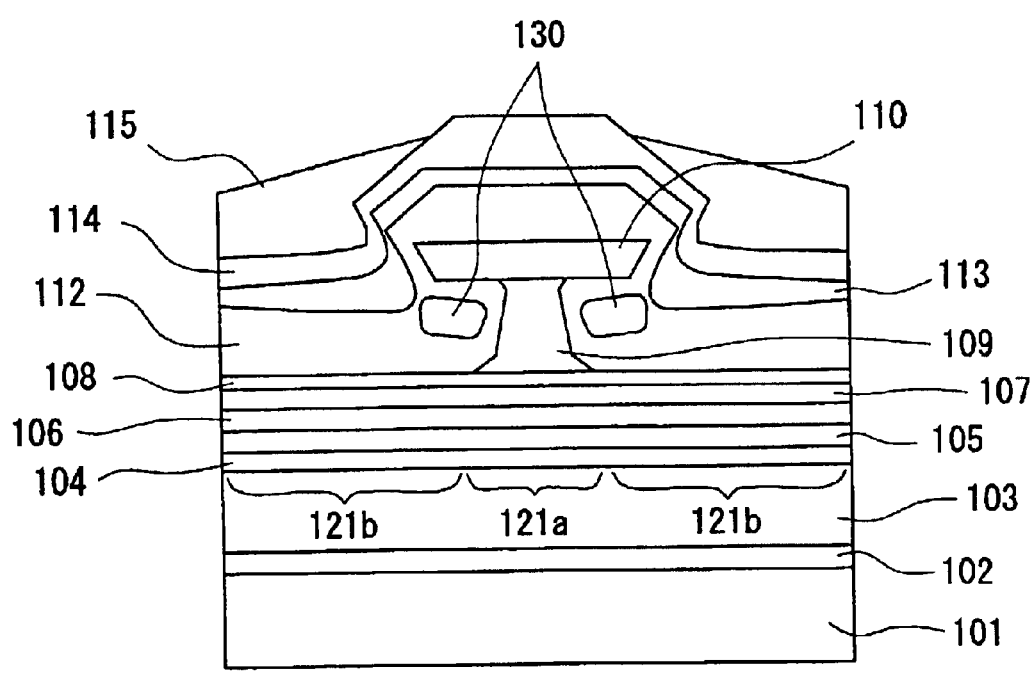
FIG. 4 is a cross sectional view showing the semiconductor laser device in the embodiment 1 of the present invention after completion of crystal growth process for current blocking layer filling.

FIG. 1 is a view showing the configuration of a semiconductor laser device in an embodiment 1 of the present invention. FIGS. 2 to 4 are views showing manufacturing method of the semiconductor laser device.

First, as shown in FIG. 2, on an n-GaAs substrate 101 having (100) plane, there are grown in sequence, by organic metal chemical vapor deposition, an n-GaAs buffer layer 102 (layer thickness of 0.5 $\mu$m), an n-$Al_{0.5}Ga_{0.5}As$ lower cladding layer 103 (layer thickness of 2.0 $\mu$m) exemplifying a first cladding layer, an $Al_{0.35}Ga_{0.65}As$ lower guiding layer 104 (layer thickness of 65 nm), a multiple pseudomorphic quantum well active layer 105 formed by alternately disposing $In_{0.1832}Ga_{0.168}As_{0.6767}P_{0.3233}$ compressive strained quantum well layers (strain of 0.17%, layer thickness of 80 Å, two layers) and $In_{0.05}Ga_{0.95}As_{0.6188}P_{0.3812}$ tensile strained barrier layers (strain of −1.0%, three layers, thicknesses of respective layers of 100 Å, 50 Å, and 100 Å from the substrate side), an $Al_{0.35}Ga_{0.65}As$ first upper guiding layer 106 (layer thickness of 65 nm), a p-$Al_{0.5}Ga_{0.5}As$ first upper cladding layer 107 (layer thickness of 0.1916 $\mu$m) exemplifying a second cladding layer, a p-GaAs etching stopper layer 108 (layer thickness of 30 Å), a p-$Al_{0.4885}Ga_{0.5115}As$ second upper cladding layer 109 (layer thickness of 1.242 $\mu$m) exemplifying a third cladding layer, and a GaAs cap layer 110 (layer thickness of 0.75 $\mu$m) exampling a semiconductor layer. Further, in an area for forming a lower-described mesa stripe portion 121a (refer to FIGS. 1, 3, 4), there is formed a resist mask 111 (mask width of 5.5 $\mu$m) so as to become a stripe in [011] direction by photo process.

Next, an area other than the resist mask 111 is etched away to form a mesa stripe portion 121a as shown in FIG. 3. The etching is performed in two steps with use of mixed solution of sulfuric acid and hydrogen peroxide water and hydrofluoric acid just onto the etching stopper layer 108. By utilizing the fact that an etching rate of GaAs by hydrofluoric acid is extremely slow, there are achieved flattening of an etching plane and width control of the mesa stripe portion 121a. An etching depth is 1.95 $\mu$m, and a width of the lowermost portion of the mesa stripe portion 121a is approx. 2.5 $\mu$m. After etching, the resist mask 111 (refer to FIG. 2) is removed. Here, a width of the cap layer 110 is larger than the width of the lowermost portion of the mesa stripe portion 121a by 0.8 $\mu$m in one side.

Next, as shown in FIG. 4, there are grown in sequence, by organometallic crystal growth, an n-$Al_{0.7}Ga_{0.3}As$ first current blocking layer 112 (layer thickness of 1.0 $\mu$m), an n-GaAs second current blocking layer 113 (layer thickness of 0.3 $\mu$m), and a p-GaAs flattening layer 114 (layer thickness of 0.65 $\mu$m) to form light and current constriction area.

The cap layer 110 is wider than the mesa stripe portion 121a and functions as an overhang for a lateral face vicinity area of the mesa stripe portion 121a, which prevents growing gas from sufficiently reaching the lateral face vicinity area of the mesa stripe portion 121a in crystal growth of the first current blocking layer 112, and therefore slows down a crystal growth rate of the lateral face vicinity area of the mesa stripe portion 121a. Further, due to plane orientation of the lateral face of the mesa stripe portion 121a, a crystal growth rate of the lateral face vicinity area of the mesa stripe portion 121a is also slowed down. However, a crystal growth rate of area not below the overhang is not slowed down. Therefore, in the lateral face vicinity of the mesa stripe portion 121a, i.e., the lateral face vicinity of a ridge stripe-shaped second upper cladding layer 109, there is generated a portion without crystal growth, i.e., a hollow portion 130 confined in the first current blocking layer 112. Here, the lowermost face of the hollow portion 130 is away from the etching stopper layer 108 by 0.5 $\mu$m, and a distance between the hollow portion 130 and the mesa stripe portion 121a is 0.3 $\mu$m.

After that, there is formed by photo process a resist mask 115 only on distant areas 121b on the both sides of the mesa stripe portion 121a. Next, the first and the second current blocking layers 112 and 113, and the flattening layer 114 on the mesa stripe portion 121a are removed by etching. The etching is performed in two steps with use of mixed solution of ammonium and hydrogen peroxide water and mixed solution of sulfuric acid and hydrogen peroxide water. Then, the resist mask 115 is removed to laminate a p-GaAs cap layer 116 (layer thickness of 2.0 $\mu$m) as shown in FIG. 1. Thus, the semiconductor laser device configured as shown in FIG. 1 may be manufactured.

In the semiconductor laser device in the embodiment 1, an oscillation wavelength is 780 nm, and stable operation for over 5,000 hours is confirmed in a reliability test at 85° C. and with 200 mW pulses. In conventional semiconductor laser devices made of AlGaAs based materials, a maximum optical output is approx. 180 W even with a hollow portion embedded for stabilizing transverse mode oscillation, and at this optical output level, end face destruction occurs. This is because the presence of active Al tends to generate Al oxide on an end face of the semiconductor laser device, which may prevent implementation of higher output, higher reliability and longer life. In the embodiment 1, however, in the vicinity of the both lateral faces of the mesa stripe portion 121a, i.e., the second upper cladding layer 109 as a ridge stripe-shaped third cladding layer, a hollow portion 130 without a semiconductor layer laminated is provided approximately parallel to the ridge stripe 121a, and a quantum well active layer 105 mainly composed of InGaAsP is used, which makes it possible to stabilize transverse mode oscillation even with the presence of the hollow portion 130. As a result of detailed study of the phenomenon, an inventor of the present invention and the like found out that the phenomenon is attributed to the fact that a refractive index of InGaAsP based material used for the quantum well active layer 105 is smaller than that of AlGaAs based material. More specifically, in the semiconductor laser device having the aforementioned hollow portion 130, use of InGaAsP based material for the quantum well active layer 105 decreases difference in refractive index between the hollow portion 130 and the quantum well active layer 105 compared to the conventional case, thereby providing an acceptable difference of refractive index sufficient for stabilizing a single transverse mode oscillation. Thus, the above effect is considered to be obtained. In addition, as a result of putting the semiconductor laser device into a reliability test of 70° C. and 230 mW, stable operation for over 10,000 hours was confirmed. This could be attributed to the fact that oxidation is unlikely since the quantum well active layer 105 does not contain Al.

Also in the embodiment 1, the hollow portion 130 is away from the etching stopper layer 108 by 0.3 μm or more, and therefore the hollow portion 130 is positioned not too close to the quantum well active layer 105. This makes it possible to prevent light confining effect from becoming too strong and to restrain absorption of a laser light into the substrate 101, thereby bringing about the effect of implementing higher output and higher reliability of the semiconductor laser device. With the distance between the hollow portion 130 and the etching stopper layer 108 being too large, optical effects such as light confining effect are weakened, so that the distance to be set needs to be 0.6 μm or less. Therefore, the above distance is preferably 0.3 to 0.6 μm.

Figure 5:
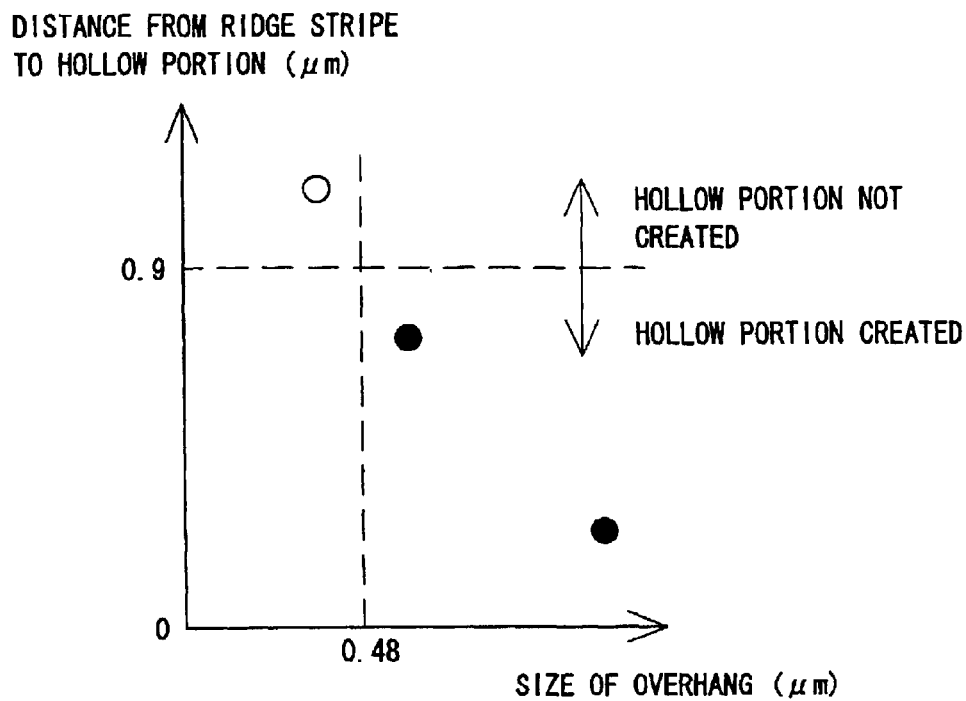
FIG. 5 is a graph showing the relationship between the size of an overhang, presence of a hollow portion, and a distance from a ridge stripe in a semiconductor laser device of the present invention.
Figure 6:
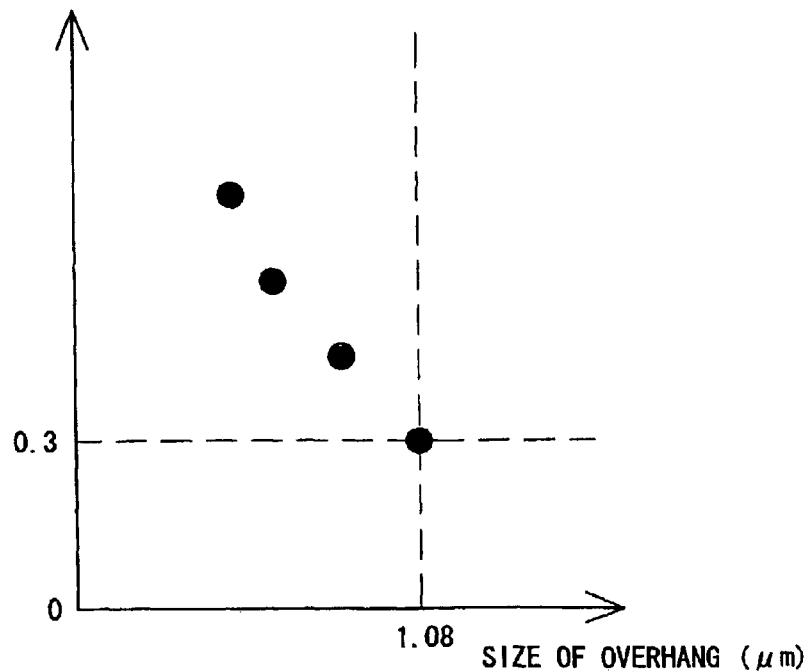
FIG. 6 is a graph showing the relationship between the size of an overhang and a distance from an etching stopper layer to a hollow portion in a semiconductor laser device of the present invention.

Also in the embodiment 1, a width of the cap layer 110 is larger than a lowermost width of the mesa stripe portion 121a by 0.7 μm in one side. As is clear from FIGS. 5 and 6, if the width of the cap layer 110 is larger than the lowermost width of the mesa stripe portion 121a by 0.48 μm to 1.08 μm in one side, a hollow portion 130 may be formed away from the etching stopper layer 108 by 0.3 μm. That is to say, the hollow portion 130 of an optimum size is formed in an optimum position, thereby implementing higher reliability and long life for stable transverse mode oscillation in high output driving state. FIG. 5 shows that the hollow portion is created with the size of an overhang (expressed by ½ of a difference between the width of the cap layer 110 and the lowermost width of the mesa stripe portion 121a) being 0.48 μm or more (a black spot in FIG. 5), whereas the hollow portion is not created with the size of the overhang being less than 0.48 μm (white dot in FIG. 5). FIG. 6 shows that with the size of the overhang being over 1.08 μm, the first current blocking layer 112 has difficulty in growing under the overhang, and therefore 0.3 μm or more growth of the first current blocking layer 112 on the etching stopper layer 108 is not achieved. Accordingly, the width of the cap layer 110 needs to be larger than the lowermost width of the mesa stripe portion 121a in the range of 0.48 μm to 1.08 μm in one side.

Also in the embodiment 1, the second upper cladding layer 109 is in a ridge stripe shape, and the shape is reverse mesa configuration. Accordingly, the hollow portion 130 is present in a more preferable position for stable transverse mode oscillation in high output driving state, which brings about the above effect. The reverse mesa configuration herein refers to the shape of the ridge stripe narrowed toward the substrate or narrowed in the middle in a cross section vertical to extending direction of the ridge stripe.

Also in the embodiment 1, although the lower cladding layer 103 is composed of a single $Al_{0.5}Ga_{0.5}As$, the lower cladding layer may be structured, for example, by laminating a first lower cladding layer and a second lower cladding layer in sequence, the first lower cladding layer being composed of $Al_{0.445}Ga_{0.555}As$ while the second lower cladding layer being composed of $Al_{0.561}Ga_{0.439}As$. Thus, by structuring the lower cladding layer from the first and the second lower cladding layers laminated in sequence in two steps, and by setting an Al mixed crystal ratio in the second lower cladding layer high, a laser light escaping toward the GaAs substrate 101 is effectively sealed, thereby further restraining adsorption of light into the GaAs substrate 101 in high output operation. This brings about an effect of implementing still higher output and higher reliability of the semiconductor laser device.

Also in the embodiment 1, the compressive strained quantum well layers composed of InGaAsP are provided on the GaAs substrate 101. This implements a high-output semiconductor laser device with high reliability and long life particularly in a 780 nm band. Further, presence of the hollow portion 130 provides a high-output semiconductor laser device having higher reliability. In addition, a compressive strain percentage of the compressive strained quantum well layer is 0.17% that is within 3.5%, which brings about the above effect more preferably. The strain percentage is herein expressed by (al-aGaAs)/aGaAs where aGaAs represents a lattice constant of the GaAs substrate 101 and al represents a lattice constant of the compressive strained quantum well layer. If the percentage value is positive, the strain is called compressive strain, whereas if the value is negative, the strain is called tensile strain.

Also in the embodiment 1, when a composition ratio of the compressive strained quantum well layer was changed to increase a strain percentage in the 780 nm band, an experimentally-manufactured semiconductor laser device showed a tendency of deterioration of reliability in a region of the strain percentage over 3.5%. It was found out, therefore, that a laser with a stable film thickness is preferably manufactured when the strain percentage of the compressive strained quantum well layer is 3.5% or less.

Also in the embodiment 1, the tensile strained barrier layers composed of InGaAsP are provided in the multiple pseudomorphic quantum well active layer 105 to compensate the compressive stain of the compressive strained quantum well layer, which makes it possible to manufacture a multiple pseudomorphic quantum well active layer 105 having more stable crystal, thereby implementing a semiconductor laser device with high reliability. The above effect is more preferably obtained by setting the tensile strain percentage to 3.5% or less. Also in the case of increasing the tensile strain percentage, an experimentally-manufactured semiconductor laser device showed a tendency of deterioration of reliability in a region of the strain percentage over 3.5%. It was found out, therefore, that a laser with a stable film thickness is preferably manufactured when the strain percentage of a tensile strained barrier layer is 3.5% or less.

Also in the embodiment 1, the hollow portion 130 is not in contact with the lateral face of the mesa stripe portion 121a, and the first current blocking layer 112 of 0.5 $\mu$m is present on the lateral face thereof, which makes it possible to prevent AlGaAs forming the second upper cladding layer 109 from being exposed to the hollow portion 130 and oxidized there, thereby bringing about the effect of implementing higher reliability and longer life of the semiconductor laser device.

It is noted that with a distance between the hollow portion 130 and the lateral face of the second upper cladding layer 109 as the ridge stripe-shaped third cladding layer being over 0.9 $\mu$m, the hollow portion may be filled up. Therefore the distance is preferably 0.9 $\mu$m or less.

Also in the embodiment 1, the width of the lowermost portion of the mesa stripe portion 121a is set to 1.5 to 3.0 $\mu$m, which brings about the effect of oscillating more stable single transverse mode laser light.

(Embodiment 2)

Figure 7:
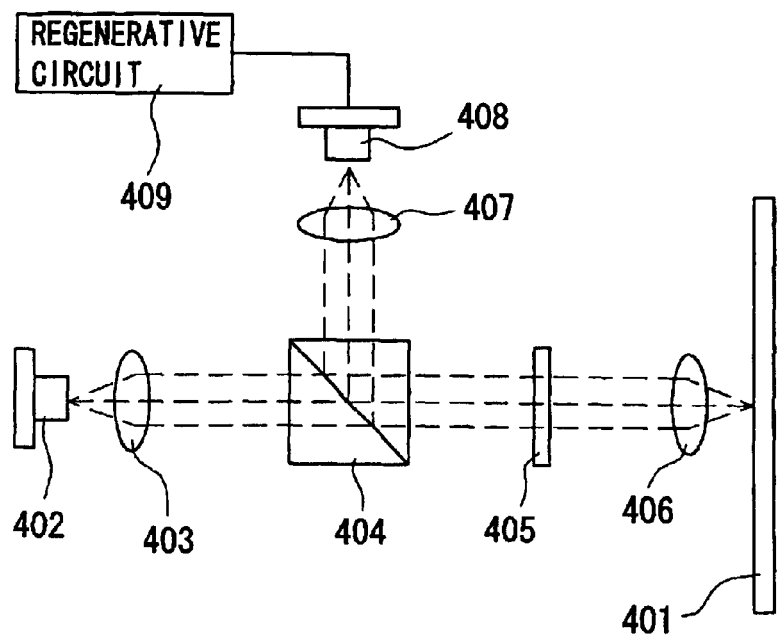
FIG. 7 is a schematic view showing an optical disk recording and reproducing apparatus in an embodiment 2 of the present invention.
Figure 8:
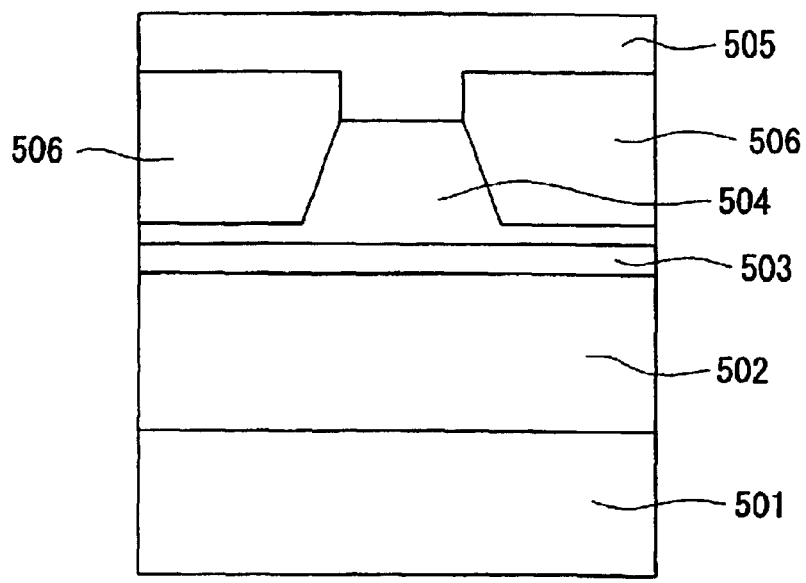
FIG. 8 is a cross sectional view showing a conventional semiconductor laser device.

FIG. 7 is a view showing the configuration of an optical disk recording and reproducing apparatus in an embodiment 2 of the present invention. The optical disk recording and reproducing apparatus is for writing data onto an optical disk 401 and reproducing the written data, which includes a semiconductor laser device 402 of the aforementioned embodiment 1 as a light emitting element used therefor.

In writing operation of the optical disk recording and reproducing apparatus, a signal light emitted from the semiconductor laser device 402 is collimated by a collimate lens 403, transmitted through a beam splitter 404, and after polarization thereof is adjusted in $\lambda/4$ polarizing plate 405, the signal light is collected by an object lens 406 and is incident on the optical disk 401. In reading operation, a laser light without carrying a data signal is incident on the optical disk 401 by following the same path as in the case of the writing operation. The laser light is reflected on the surface of the optical disk 401 in which data is recorded, and after passing through the object lens 406 for laser-irradiation and the $\lambda/4$ polarizing plate 405, the laser light is reflected by the beam splitter 404 for a 90° angle bend, and then collected by a reproduced light object lens 407 and entered into a signal detection light receiving element 408. The signal detection light receiving element 408 converts a recorded data signal to an electric signal depending on intensity of entered laser light, and a regenerative circuit 409 reproduces an original signal from the electric signal.

The optical disk recording and reproducing apparatus in the embodiment 2 of the present invention uses the semiconductor laser device 402 that produces optical output higher than conventional optical output, so that writing and reading of data is performed even with the rotational speed of the optical disk enhanced from the conventional rotational speed. Consequently, access time to the optical disk, which has been a problem especially in writing operation, is dramatically shortened compared to the case of an apparatus using a conventional semiconductor laser device, thereby providing an optical disk recording and reproducing apparatus enabling more comfortable operation.

Although there has been described an example of applying the semiconductor laser device of the embodiment 1 to an recording and reproducing-type optical disk apparatus, the semiconductor laser device is naturally applicable to an optical disk recording apparatus and an optical disk reproducing apparatus using the same wavelength of 780 nm band.

It would be understood that the semiconductor laser device and the optical disk recording and reproducing apparatus of the present invention are not limited to the above-illustrated and described embodiments, but are naturally capable of numerous modifications, e.g., modification of layer thickness and layer number of the well layer and barrier layer, without departing from the spirit of the invention.

According to the present invention as is clear from the above description, the quantum well active layer is structured from III–V group compound semiconductor containing at least P as V group element, the first cladding layer, the second cladding layer, the third cladding layer, and the first current blocking layer are structured from III–V group compound semiconductor containing only As as V group element, and a hollow portion is provided inside the first current blocking layer in the vicinity of and approximately parallel to the ridge stripe-shaped third cladding layer. This provides a 780 nm-band high-output semiconductor laser device having stable transverse mode oscillation, high reliability in high output operation, and long life.

Also in the semiconductor laser device, a hollow portion formed inside the first current blocking layer saves an effort at preventing an overhang formed over the ridge stripe-shaped third cladding layer, which facilitates management of etchant and etching time for forming the ridge stripe-shaped third cladding layer.

Also, the optical disk recording and reproducing apparatus of the present invention uses the semiconductor laser device, which enables high speed reading and writing operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising in sequence on a GaAs substrate: a first cladding layer having a first conduction type; a quantum well active layer; a second cladding layer having a second conduction type; and a ridge stripe-shaped third cladding layer having a same conduction type as the second cladding layer, as well as a current blocking layer having a first conduction type located on both sides of the third cladding layer, the quantum well active layer being structured from III–V group compound semiconductor containing at least P as V group element, the first cladding layer, the second cladding layer, the third cladding layer, and the current blocking layer being structured from III–V group compound semiconductor containing only As as V group element, and wherein a hollow portion is provided inside the current blocking layer in the vicinity of and approximately parallel to the ridge stripe-shaped third cladding layer.

2. The semiconductor laser device as defined in claim 1, wherein right above the ridge stripe-shaped third cladding layer, there is laminated a cap/intermediate layer having a width larger than a width of a lowermost portion of the ridge stripe-shaped third cladding layer.

3. The semiconductor laser device as defined in claim 1, wherein the ridge stripe-shaped third cladding layer has a reverse mesa shape in cross section.

4. The semiconductor laser device as defined in claim 2, wherein a width of the cap/intermediate layer on the ridge stripe-shaped third cladding layer is larger than a width of a lowermost portion of the ridge stripe-shaped third cladding layer, and wherein assuming that the width of the cap/intermediate layer is X, and that the width of the lowermost portion of the ridge stripe-shaped third cladding layer is Y, (X−Y)/2 is in a range from 0.48 $\mu$m to 1.08 $\mu$m in one side.

5. The semiconductor laser device as defined in claim 1, wherein the third cladding layer and the current blocking layer are provided on an etching stopper layer on the second cladding layer, and distance between the hollow portion and the etching stopper layer is 0.3 to 0.6 $\mu$m.

6. The semiconductor laser device as defined in claim 1, wherein the current blocking layer is present between a lateral face of the ridge stripe-shaped third cladding layer and the hollow portion, so that the lateral face of the ridge stripe-shaped third cladding layer is not exposed to the hollow portion.

7. The semiconductor laser device as defined in claim 1, wherein a lowermost portion of the ridge stripe-shaped third cladding layer has a width of 1.5 to 3.0 $\mu$m.

8. The semiconductor laser device as defined in claim 1, wherein the quantum well active layer includes at least a well layer and a barrier layer, and at least the well layer is composed of InGaAsP.

9. The semiconductor laser device as defined in claim 1, wherein the quantum well active layer is a pseudomorphic quantum well active layer.

10. The semiconductor laser device as defined in claim 1, wherein the well layer in the quantum well active layer has compressive strain.

11. The semiconductor laser device as defined in claim 10, wherein a percentage of compressive strain present in the well layer is within 3.5%.

12. The semiconductor laser device as defined in claim 8, wherein the barrier layer in the quantum well active layer has tensile strain.

13. The semiconductor laser device as defined in claim 12, wherein a percentage of tensile strain present in the barrier layer is within 3.5%.

14. The semiconductor laser device as defined in claim 1, wherein the first cladding layer is composed of two AlGaAs layers each having different Al mixed crystal ratios, out of which one layer closer to the quantum well active layer has higher Al crystal mixed ratio than that of the other layer.

* * * * *